United States Patent [19]

Khabbaz

[11] Patent Number: 5,309,048

[45] Date of Patent: May 3, 1994

[54] DISTRIBUTED DIGITAL ATTENUATOR

[75] Inventor: R. Brian Khabbaz, Belleville, N.J.

[73] Assignee: ITT Corporation, New York, N.Y.

[21] Appl. No.: 950,480

[22] Filed: Sep. 24, 1992

[51] Int. Cl.$^5$ .............................. H03H 11/24
[52] U.S. Cl. .................... 307/542; 307/264; 307/555; 307/568; 333/81 A
[58] Field of Search .............. 333/81 R, 81 A; 307/264, 542, 555, 568

[56] References Cited

U.S. PATENT DOCUMENTS

| | | | |
|---|---|---|---|
| 4,438,415 | 3/1984 | Hopfer | 333/81 A |
| 4,837,530 | 6/1989 | Kondoh | 307/568 |
| 5,001,524 | 3/1991 | Golio et al. | 333/81 R |
| 5,006,735 | 4/1991 | Taylor | 307/264 |
| 5,049,841 | 9/1991 | Cooper et al. | 307/568 |
| 5,109,204 | 4/1992 | Keefer | 333/81 A |
| 5,157,323 | 10/1992 | Ali et al. | 333/81 R |

Primary Examiner—Richard A. Bertsch
Assistant Examiner—David W. Scheuermann
Attorney, Agent, or Firm—Patrick M. Hogan; Arthur L. Plevy

[57] ABSTRACT

A digital attenuator circuit for attenuating RF frequencies implemented as an MMIC having series microstrip transmission lines between an RF input terminal and an RF output terminal and having at least one shunt path comprised of a series combination of a MESFET able to be switched between a conducting state and a nonconducting state and a thin-film resistor, wherein the circuit employs a distributed topology whereby when the MESFET is in the conducting state the impedance of the microstrip transmission lines matches the impedance of the shunt elements thereby enabling the circuit to operate over a wide bandwidth.

26 Claims, 6 Drawing Sheets

DISTRIBUTED DIGITAL ATTENUATOR

FIELD OF THE INVENTION

The present invention relates to attenuator circuits and more particularly to a digital attenuator circuit for attenuating RF signals over a wide bandwidth range.

BACKGROUND OF THE INVENTION

An attenuator circuit is a network used to reduce the power level of a signal without introducing any appreciable distortion. As used in conventional monolithic microwave integrated circuits (MMIC's), attenuator circuits are used to decrease the magnitude of radio frequency signals. Attenuator circuits, conventionally known as attenuators can be active or passive devices. Attenuators are well known in the art. See H. Kondoh, "DC-50 GHz MMIC Variable Attenuator with 30 dB Dynamic Range," IEEE MTT-S Digest, 1988; G. B. Norris, et. al, "A Fully Monolithic 4–18 GHz Digital Vector Modulator," IEEE MTT-S Digest, 1990, pp. 789–792; Y. Hwang, et. al, "A Microwave Phase and Gain Controller with Segmented-Dual Gate MESFETs in GaAs MMIC's," IEEE 1984 Microwave and MM-Wave Monolithic Circuits Symposium, 1984, pp. 1–5; R. Gupta, et. al, "A 0.05 to 14 GHz MMIC 5-bit Digital Attenuator," Proc. GaAs IC Symposium Digest, 1987, pp. 231–234; McGrath and Pratt, "An Ultra-Broadband DC-12 GHz 4-bit GaAs Monolithic Digital Attenuator," Proc. GaAs IC Symposium Digest, 1991, pp. 247–250; and F. Ali, et. al, "Low-Loss, High-Power, Broadband GaAs MMIC Multi-bit Digital Attenuators with On-Chip TTL Drivers," Proc. GaAs IC Symposium Digest, 1991, pp. 243–246. Analog variable attenuators are able to achieve broadband performance. However, linearization for attenuation v. control voltage is required for such devices, and performance can vary according to the operating temperature.

Conventional digital attenuators may include the following circuit topologies to achieve broadband performance: segmented dual-gate active attenuators; binary weighted attenuators connected by transfer switches; and field-effect transistor (FET) based "non-distributed" attenuators. The disadvantages of these designs include: low attenuation accuracy and die-to-die variation for the dual-gate active attenuators; high insertion losses for the transfer switch approach; and limited frequency and attenuation range for the "non-distributed" attenuators.

It is an object of this invention to provide a digital attenuator circuit which employs a "distributed" topology implemented as an MMIC, wherein the impedance of the shunt elements of the circuit are matched with of high-impedance transmission lines, to achieve broadband performance without any of the aforementioned limitations found in conventional attenuators.

SUMMARY OF THE INVENTION

The present invention is a digital attenuator circuit for attenuating RF frequencies which is implemented as an MMIC having high-impedance microstrip transmission lines coupled in series between an RF input terminal and an RF output terminal and further having at least one shunt path comprised of a series combination of a metal-semiconductor field-effect transistor (MESFET) able to switch between a conducting state and a non-conducting state, and a thin-film resistor. The digital attenuator circuit employs a distributed topology whereby when the MESFET is in the conducting state, the impedance of the microstrip transmission lines matches the sum of the impedances of the MESFET and the thin-film resistor, thereby enabling the circuit to operate over a wide bandwidth range.

DETAILED DESCRIPTION OF THE DRAWINGS

Figure 1:
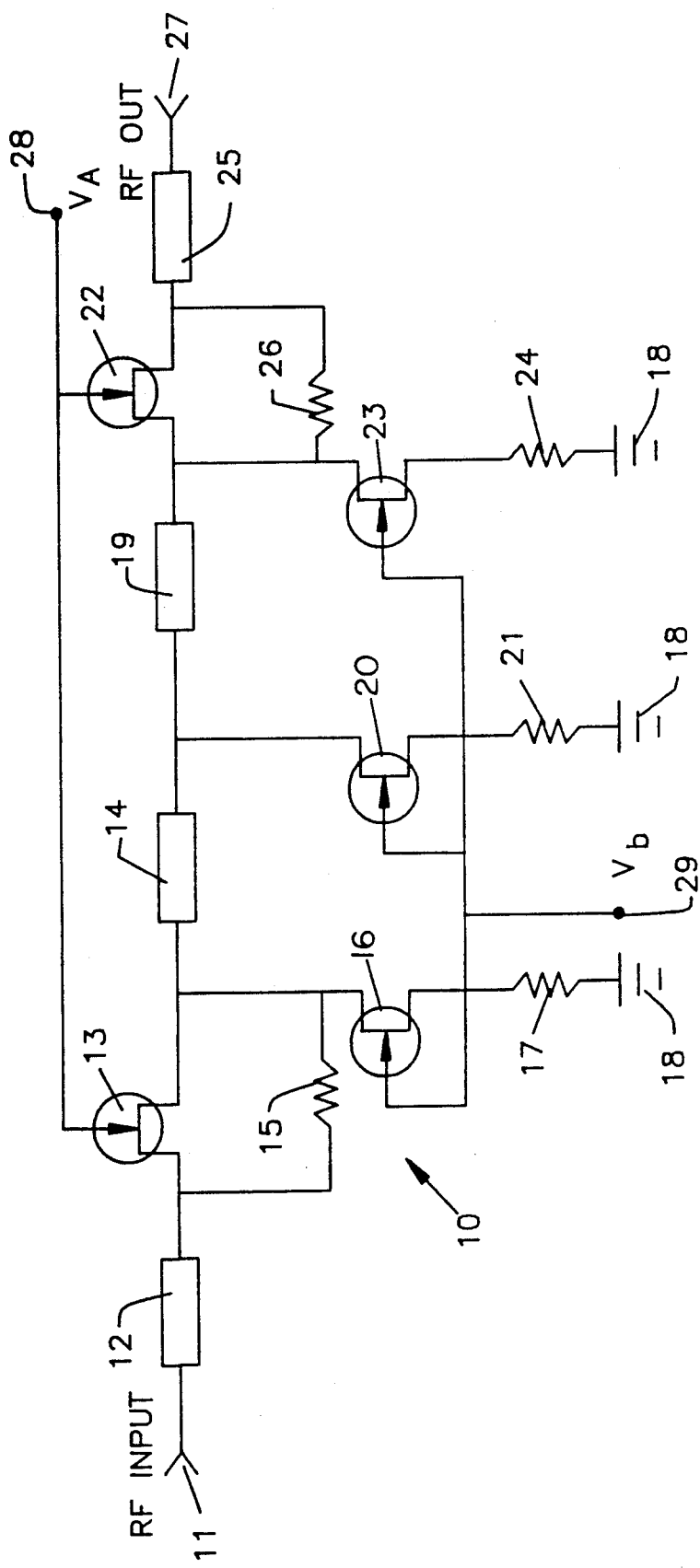
FIG. 1 shows an exemplary embodiment of the distributed digital attenuator circuit which is the object of this invention.

Referring to FIG. 1 there is shown a distributed digital attenuator circuit 10 used to attenuate RF signals over a wide bandwidth range. The distributed digital attenuator circuit 10 is implemented as an MMIC utilizing MESFETs, thin-film resistors and microstrip transmission lines.

An RF input terminal 11 of the distributed digital attenuator circuit 10 is coupled to the input terminal of a microstrip transmission line 12. The output terminal of the microstrip transmission line 12 is coupled to the source electrode of a MESFET 13. The drain electrode of the transistor 13 is coupled to the input terminal of a microstrip transmission line 14. A resistor 15 appears in shunt with the source to drain path of the transistor 13. A MESFET 16 forms part of a shunt path at the drain electrode of the transistor 13. A first terminal of the resistor 15 is coupled to the output terminal of the microstrip transmission line 12 and to the source electrode of the transistor 13. The other terminal of the resistor 15 is coupled to the drain electrode of the transistor 13 and to the input terminal of the microstrip transmission line 14.

The drain electrode of the transistor 16 is coupled to the drain electrode of the transistor 13 and to the input terminal of the microstrip transmission line 14. The source electrode of the transistor 16 is coupled to the first terminal of a series resistor 17. The outer terminal of the resistor 17 is coupled to a point of reference potential or ground 18.

The output terminal of the microstrip transmission line 14 is coupled to the input terminal of a microstrip transmission line 19. A MESFET transistor 20 forms part of a shunt path at a junction between the output terminal of the microstrip transmission line 14 and the input terminal of the microstrip transmission line 19. The drain electrode of the transistor 20 is coupled to the output terminal of microstrip transmission line 14 and to the input terminal of the microstrip transmission line 19. The source electrode of the transistor 20 is coupled to a first terminal of a series resistor 21. The outer terminal of the resistor 21 is coupled to a point of reference potential or ground 18.

The output terminal of the microstrip transmission line 19 is coupled to the source electrode of a MESFET transistor 22. A MESFET transistor 23 forms part of a shunt path at a junction between the output terminal of the microstrip transmission line 19 and the source electrode of the transistor 22. The drain electrode of the transistor 23 is coupled to the output terminal of the microstrip transmission line 19 and to the source electrode of the transistor 22. The source electrode of the transistor 23 is coupled to the first terminal of a series resistor 24. The outer terminal of the resistor 24 is coupled to a point of reference potential or ground 18.

The drain electrode of the transistor 22 is coupled to the input terminal of a microstrip transmission line 25. A resistor 26 appears in shunt with the source to drain path of the transistor 22. A first terminal of the resistor 26 is coupled to the output terminal of the microstrip transmission line 19, to the source electrode of the transistor 22 and to the drain electrode of the transistor 23. The outer terminal of the resistor 26 is coupled to the drain electrode of the transistor 22 and to the input terminal of the microstrip transmission line 25. The output terminal of the microstrip transmission line 25 is coupled to an RF output terminal 27 of the distributed digital attenuator circuit 10. The gate electrodes of the transistors 13 and 22 are commonly interconnected to a supply terminal Va 28. The gate electrodes of the transistors 16, 20 and 23 are commonly interconnected to a supply terminal Vb 29.

The distributed digital attenuator circuit 10 employs MESFETs 13, 16, 20, 22 and 23, which are selectively switched ON and OFF, to toggle the attenuator circuit 10 between a low-loss through state and a resistive attenuation state. In the low-loss through state, the series MESFETs 13 and 22 are switched to the conducting or ON state while the shunt MESFETs 16, 20 and 23 are switched to the nonconducting or OFF state. In the attenuation state the situation is reversed with the series MESFETs 13 and 22 switched to the nonconducting or OFF state while the shunt MESFETs 16, 20 and 23 are switched to the conducting or ON state. When switched ON, the MESFETs 13, 16, 20, 22 and 23 operate as short circuits. When switched OFF, the MESFETs 13, 16, 20, 22 and 23 operate as capacitors. The MESFETs 13, 16, 20, 22 and 23 provide low ON-state ($V_{gs}=0V$) drain to source resistance, and low OFF-state ($V_{gs}<V_p$) drain to source capacitance.

Figure 2:
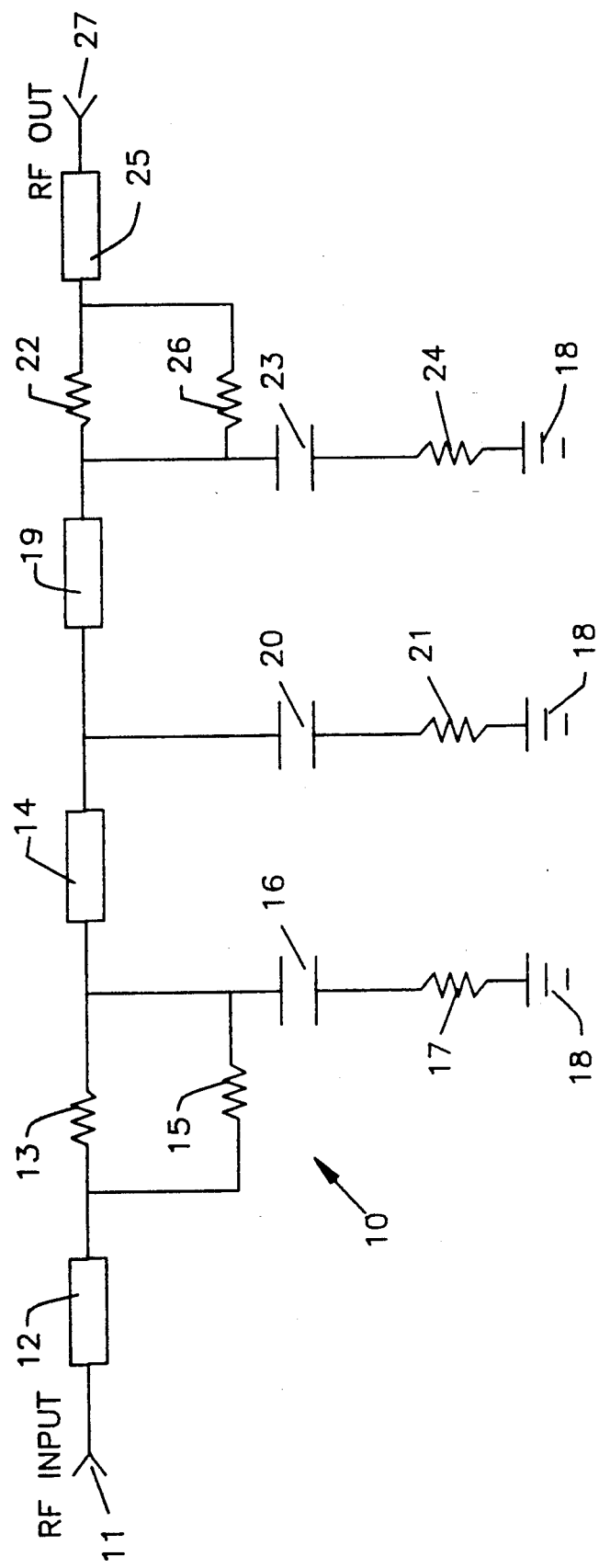
FIG. 2 shows the circuit of FIG. 1 in the through state.
Figure 3:
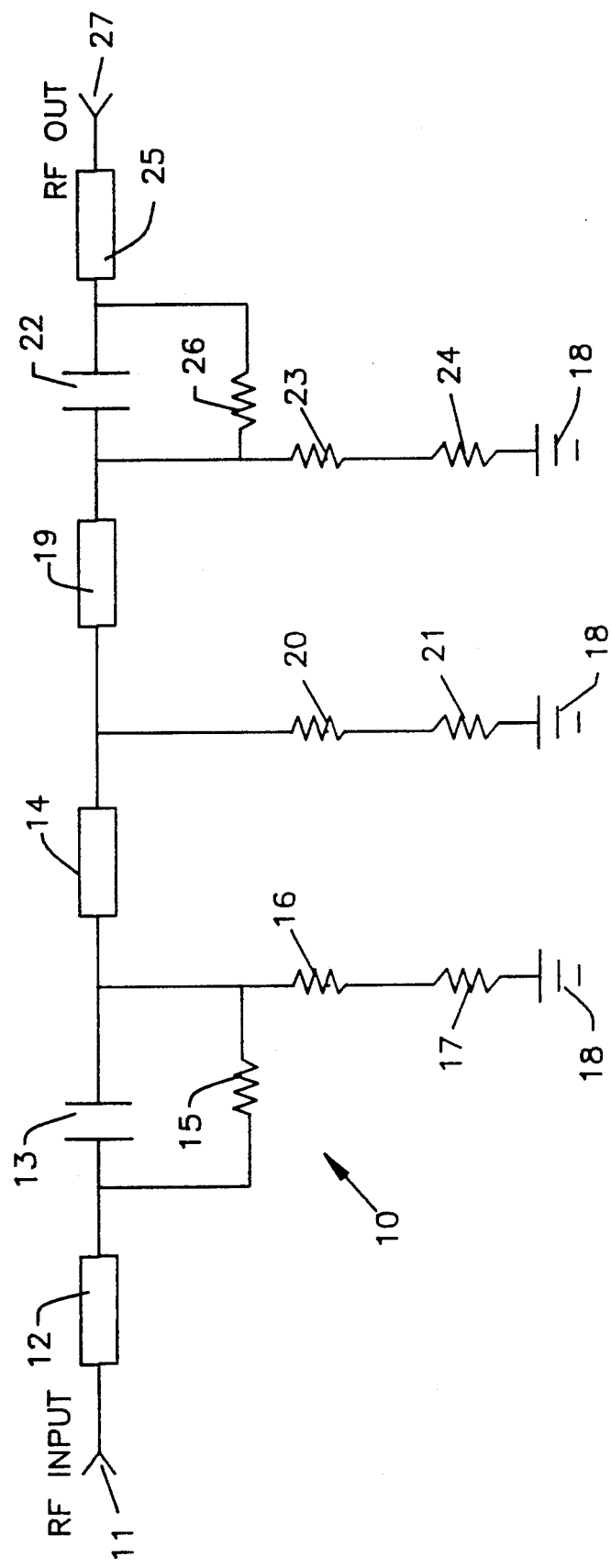
FIG. 3 shows the circuit of FIG. 1 in the attenuation state.

In the low-loss through state, the circuit 10 is reduced to a parasitic resistance from input to output with the OFF-state capacitances of the shunt MESFETs 16, 20 and 23 matched by the impedance of transmission lines 12, 14, 19 and 25, thereby enabling an RF signal to propagate through the attenuator circuit 10 with relatively little loss in signal strength (FIG. 2). In FIG. 2, the FET's are represented as capacitors which is a reasonable equivalent during the OFF state. In the attenuation state, (FIG. 3) the circuit 10 reduces to a T-type resistive attenuator with the impedance of transmission lines 12, 14, 19 and 25 matching the impedance of shunt elements 16, 17, 20, 21, 23 and 24 of the circuit 10, thereby enabling the circuit 10 to achieve broadband attenuation. In FIG. 3 the FET's are represented as resistors which is a reasonable equivalent during the ON state.

MESFETs are unipolar semiconductor devices in which the current is controlled by an electric field. The current flows in a doped semiconductor layer called a channel under the influence of an electric field. This electric field is applied to the ends of the channel at ohmic contacts—the source and the drain electrodes. The controlling element, the gate electrode, is a Schottky-barrier contact positioned between the source and the drain on the channel. A depletion region is formed beneath the gate as a result of the Schottky-barrier effect. The short length of the gate enables MESFETs to switch ON and OFF at high speeds making them particularly suited for use in high-speed integrated circuits. In order to minimize the parasitic gate-to-source resistance, the gate is frequently offset toward the source. Since MESFETs are bi-directional devices able to conduct current in either direction through the channel between the source and the drain, the positions of the drain and the source electrodes are interchangeable.

It is preferable to fabricate conventional high-speed integrated circuits, such as those used for microwave applications, from gallium arsenide (GaAs) rather than silicon because electrons have six times higher mobility and two times higher maximum drift velocity in n-type GaAs as compared to n-type silicon. In addition, the mobility of holes is approximately 15 times lower in n-type GaAs than it is in n-type silicon. Consequently, conventional MESFETs implemented as part of MMIC's are generally fabricated from GaAs. Fabricating MESFETs from GaAs rather than silicon results in lower parasitic resistances, a larger transconductance and a lower transit time for electrons in the high field region under the gate. In turn, these device characteristics result in improved microwave performance, such as lower noise, higher gain and higher cut-off frequencies. Furthermore, unlike silicon, GaAs has a high resistivity substrate which makes it an ideal medium for integrating other microwave components onto the same chip. The foregoing characteristics of n-type GaAs, together with the ability to easily fabricate Schottky barriers on n-type GaAs, has resulted in conventional MESFETs used in GaAs integrated circuits being fabricated as n-channel types of devices. N-channel GaAs MESFETs are preferred to p-channel GaAs MESFETs because of the instability of the p-type devices at low frequencies.

The distributed digital attenuator circuit 10 is able to achieve broadband performance, e.g. from DC to greater than 20 GHz, for both single bit and multi-bit digital attenuators. The distributed digital attenuator circuit 10 can be implemented using either a $\pi$ or a T distributed topology.

The distributed topology is novel because conventional digital attenuators do not match the impedance of the shunt elements with high-impedance transmission lines. Conventional digital attenuators have a large performance degradation above 12 GHz because the parasitic capacitances of the shunt elements become significant and are not matched, thus making broadband performance unattainable. Because the distributed topology permits attenuation over a broad bandwidth range, attenuators can be cascaded together to attain large attenuation values, e.g. greater than 60 dB. The wavelengths of the high-impedance microstrip transmission lines 12, 14, 19 and 25 of the attenuator circuit 10 are generally less than $\lambda/4$, where $\lambda$ is determined from the ratio of the speed of light to the center frequency at which the attenuator circuit 10 operates. The high-impedance microstrip transmission lines 12, 14, 19 and 25 have a typical impedance of between 70-170 $\Omega$, and a typical thickness of between 80-12 microns.

The distributed digital attenuation circuit 10 achieves high-dynamic range with flat normalized attenuation. The distributed digital attenuation circuit 10 is designed to provide constant normalized attenuation (attenuation above insertion loss) and low I/O VSW in both the low-loss through state and the attenuation state over the full DC to 20 GHz band. The attenuation value of each attenuator is determined from the combination of the resistance of the thin-film resistors and the parasitic resistance of the shunt MESFETs. Since the distributed digital attenuator circuit 10 is implemented as an MMIC, the circuit 10 is fabricated using automated techniques and, therefore, no final adjustment can be made to the circuit 10 after it has been fabricated.

Figure 4:
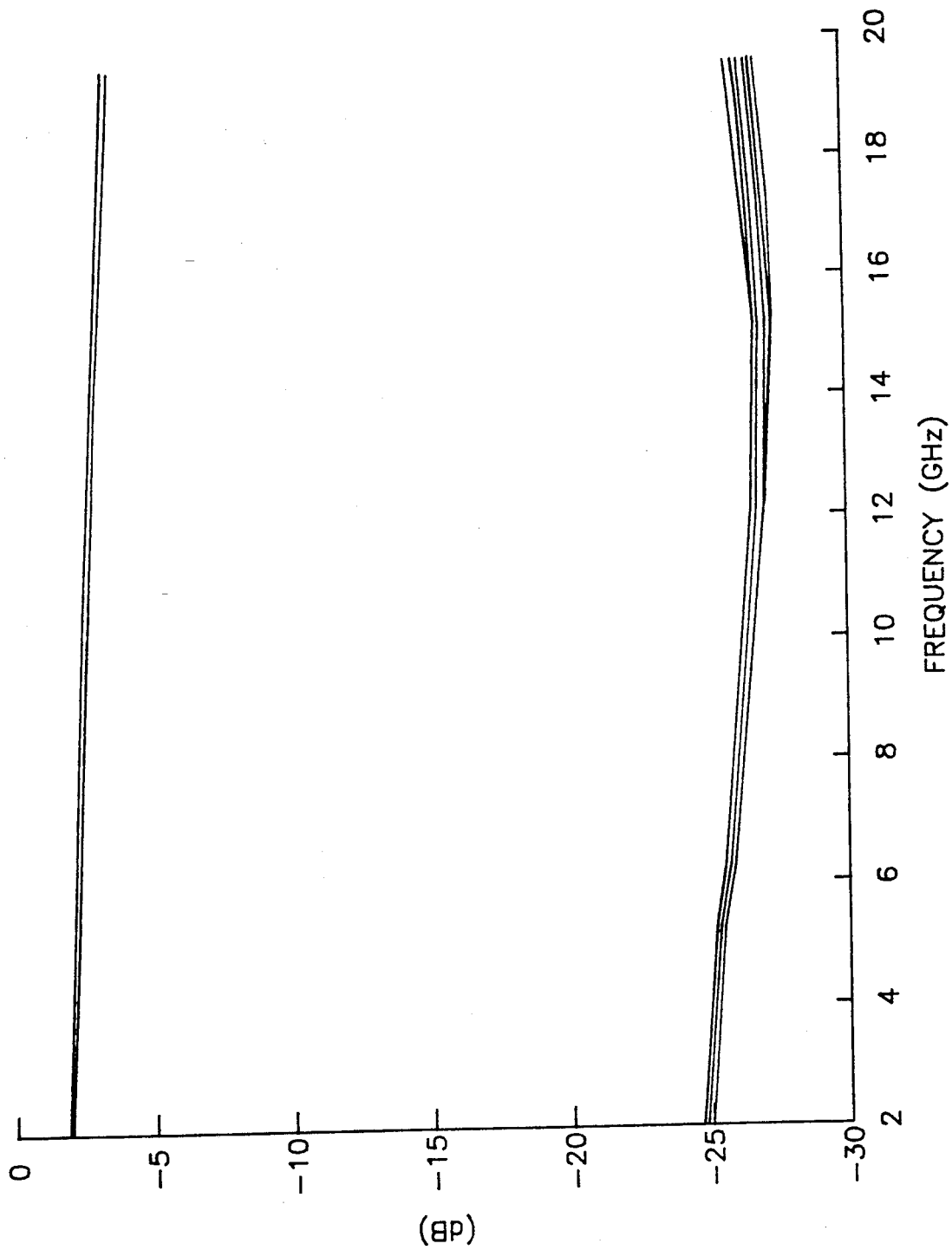
FIG. 4 shows a plot of the attenuation v. frequency performance for attenuator circuits of the type shown in FIG. 1.

Referring to FIG. 4 there is shown a plot of the attenuation v. frequency performance for distributed digital attenuator circuits of the type shown in FIG. 1 in both the through state and the attenuation state. This plot, which includes the wafer-probe performance of all die on a single wafer, shows the uniformity of the performance of the digital attenuators with a standard deviation of less than 0.2 dB for through state insertion loss.

Figure 5:
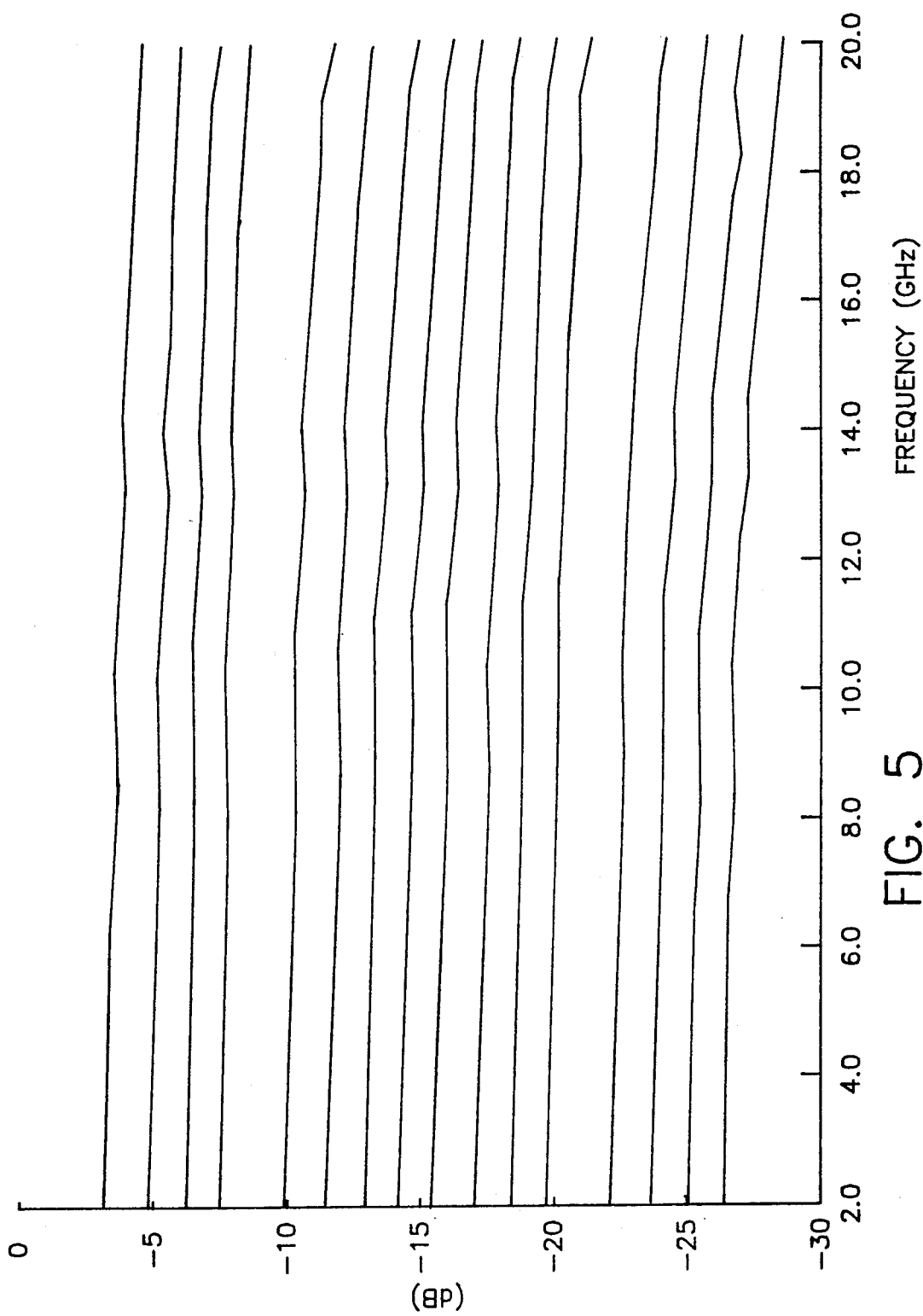
FIG. 5 shows a plot of the on-wafer performance for all 16 states of a 4-bit attenuator circuit employing the distributed topology.

Referring to FIG. 5 there is shown a plot of the on-wafer performance for all 16 states of a 4-bit attenuator comprised of four attenuators of the type shown in FIG. 1 which have been cascaded together. The normalized mean attenuation accuracy is better than 0.5 dB across the 2 to 20 GHz frequency band.

Figure 6:
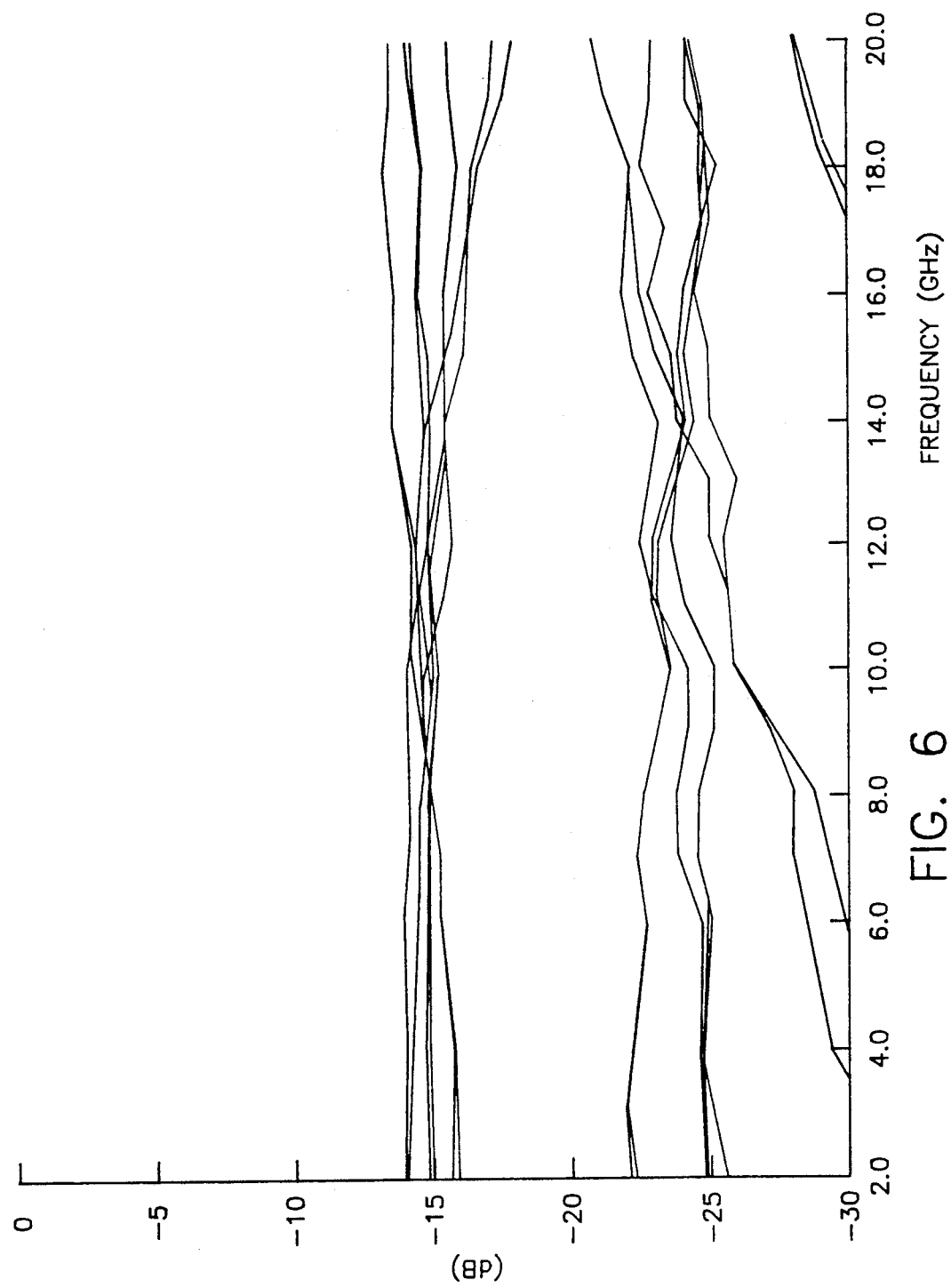
FIG. 6 shows a plot of the input return loss for all 16 states of the 4-bit attenuator of FIG. 5.

Referring to FIG. 6 there is shown a plot of the input return loss for all sixteen states of the 4-bit attenuator of FIG. 5.

It will be understood that the embodiment described herein, including the values given for the typical impedances and the typical thicknesses of the microstrip transmission lines, is merely exemplary and that a person skilled in the art may make many variations and modifications to the described embodiments utilizing functionally equivalent elements to those described. Any variations or modifications to the invention just described are intended to be included within the scope of said invention as defined by the appended claims.

What is claimed:

1. A digital attenuator circuit for attenuating RF signals, said attenuator circuit comprising:
   an input terminal for receiving an input signal to be attenuated;
   an output terminal for outputting the attenuated output signal;
   impedance means extending between said input and output terminals;
   first active device means coupled to said impedance means and having a control terminal;
   a second active device means coupled to said impedance means and having a control terminal; and
   a third active device means coupled to said impedance means and having a control terminal, said active device means controllable jointly to switch between a non-conducting and a conducting state when a given potential is applied to said control terminals, wherein said attenuator circuit is at a state of maximum attenuation when said active device means are in said conducting state and is at a state of minimum attenuation when said active device means are in said non-conducting state, and wherein said first, second, and third active device means have an impedance matched by said impedance means when in said non-conducting state whereby said input signal may propagate through said attenuator circuit with relatively little loss in signal strength.

2. The attenuator circuit according to claim 1, wherein each of said active device means is comprised of a series combination of a metal-semiconductor field-effect transistor and a thin-film resistor.

3. The attenuator circuit according to claim 1, wherein said impedance means comprises a plurality of high-impedance microstrip transmission lines.

4. The attenuator circuit according to claim 1, wherein said attenuator circuit is fabricated as part of a monolithic device.

5. An attenuator circuit according to claim 1, wherein said impedance means comprises a fourth active device means coupled to said input port and a fifth active device means coupled to said output port, said fourth and fifth active device means being adapted to switch from a conducting state to a non-conducting state when said first, second, and third active device means switch to said conducting state.

6. An attenuator circuit according to claim 1, wherein said impedance means is a first impedance means, and wherein said circuit further comprises:
   second impedance means coupled in series with said first impedance means and extending between said first impedance means and said output terminal;
   fourth active device means coupled to said second impedance means and having a control terminal;
   fifth active device means coupled to said second impedance means and having a control terminal; and
   sixth active device means coupled to said second impedance means and having a control terminal, said fourth, fifth, and sixth active device means controllable jointly to switch between a non-conducting and a conducting state when a given potential is applied to corresponding control terminals thereof, wherein said control terminals of said fourth, fifth, and sixth active device means are interconnected and wherein said attenuator circuit is at a state of maximum attenuation when all of said active device means are in said conducting state and is at a state of minimum attenuation when all of said active device means are in said non-conducting state.

7. A digital attenuator circuit for attenuating RF signals, said attenuator circuit having an RF input port and an RF output port, comprising:
   first impedance means having a first terminal and a second terminal said first terminal of said first impedance means being coupled to said RF input port, said first impedance means having a first given resistive impedance;
   first active device means having a first terminal and a second terminal, said first terminal of said first active device means being coupled to said second terminal of said first impedance means, said first active device means having a first control terminal for receiving a first switching voltage causing said first active device means to switch between a first conducting state and a first nonconducting state;
   resistive means having a first terminal and a second terminal, said first terminal of said resistive means being coupled to said second terminal of said first impedance means and to said first terminal of said first active device means, said second terminal of said resistive means being coupled to said second terminal of said first active device means;

second active device means having a first terminal and a second terminal, said first terminal of said second active device means being coupled to said second terminal of said first active device means and to said second terminal of said resistive means, said second terminal of said second active device means being coupled to a point of reference potential, said second active device means having a second control terminal for receiving a second switching voltage causing said second active device means to switch between a second conducting state and a second nonconducting state, said first active device means being switched on when said second active device means is switched off, and said first active device means being switched off when said second active device means is switched on, said second active device means having a second given resistive impedance in said second conducting state and a substantially higher resistive impedance in said second nonconducting state; and second impedance means having a first terminal and a second terminal, said first terminal of said second impedance means being coupled to said terminal of said first active device means, to said second terminal of said resistive means and to said first terminal of said second active device means, said second terminal of said second impedance means being coupled to said RF output port, said second impedance means having said first given resistive impedance, whereby said first given resistive impedance matches said second given resistive impedance thereby enabling said attenuator circuit to operate over a wide bandwidth range.

8. The attenuator circuit according to claim 7, wherein said first active device means is a metal-semiconductor field-effect transistor.

9. The attenuator circuit according to claim 7, wherein said second active device means is comprised of a series combination of a metal-semiconductor field-effect transistor and a thin-film resistor.

10. The attenuator circuit according to claim 7, wherein said first and said second impedance means are high-impedance microstrip transmission lines.

11. The attenuator circuit according to claim 7, wherein said resistive means is a thin-film resistor.

12. The attenuator circuit according to claim 7, wherein said attenuator circuit is fabricated as part of a monolithic device.

13. The attenuator circuit according to claim 7, wherein said attenuator circuit provides constant normalized attenuation up to 20 GHz.

14. A digital attenuator circuit for attenuating RF signals, said attenuator circuit having an RF input port and an RF output port, comprising:

first impedance means having a first terminal and a second terminal, said first terminal of said first impedance means being coupled to said RF input port, said first impedance means having a first given resistive impedance;

first active device means having a first terminal and a second terminal, said first terminal of said first active device means being coupled to said second terminal of said first impedance means, said first active device means having a first control terminal for receiving a first switching voltage causing said first active device means to switch between a first conducting state and a first nonconducting state;

first resistive means having a first terminal and a second terminal, said first terminal of said first resistive means being coupled to said second terminal of said first impedance means and to said first terminal of said first active device means, said second terminal of said first resistive means being coupled to said second terminal of said first active device means;

second active device means having a first terminal and a second terminal, said first terminal of said second active device means being coupled to said second terminal of said first active device and to said second terminal of said first resistive means, said second terminal of said second active device means being coupled to a first point of reference potential, said second active device means having a second control terminal for receiving a second switching voltage causing said second active device means to switch between a second conducting state and a second nonconducting state, said second active device means having a second given resistive impedance in said second conducting state and a substantially higher resistive impedance in said second nonconducting state;

second impedance means having a first terminal and a second terminal, said first terminal of said second impedance means being coupled to said second terminal of said first active device means, to said second terminal of said first resistive means and to said first terminal of said second active device means, said second impedance means having said first given resistive impedance;

third active device means having a first terminal and a second terminal, said first terminal of said third active device means being coupled to said second terminal of said second impedance means and said second terminal of said third active device means being coupled to a second point of reference potential, said third active device means having a third control terminal for receiving a third switching voltage causing said third active device means to switch between said second conducting state and said second nonconducting state, said third active device means having said second given resistive impedance in said second conducting state and said substantially higher resistive impedance in said second nonconducting state;

third impedance means having a first terminal and a second terminal, said first terminal of said third impedance means being coupled to said second terminal of said second impedance means and to said first terminal of said third active device means, said third impedance means having said first given resistive impedance;

fourth active device means having a first terminal and a second terminal, said first terminal of said fourth active device means being coupled to said second terminal of said third impedance means and said second terminal of said fourth active device means being coupled to a third point of reference potential, said fourth active device means having a fourth control terminal for receiving a fourth switching voltage causing said fourth active device means to switch between said second conducting state and said second nonconducting state, said fourth active device means having said second given resistive impedance in said second conducting state and said substantially higher resistive impedance in said second nonconducting state;

fifth active device means having a first terminal and a second terminal, said first terminal of said fifth active device means being coupled to said second terminal of said third impedance means and to said first terminal of said third active device means, said fifth active device means having a fifth control terminal for receiving a fifth switching voltage causing said fifth active device means to switch between said first conducting state and said first nonconducting state, said first and said fifth active device means being switched on when said second, said third and said fourth active device means are switched off, and said first and said fifth active device means being switched off when said second, said third and said fourth active device means are switched on;

second resistive means having a first terminal and a second terminal, said first terminal of said second resistive means being coupled to said second terminal of said third impedance means, to said first terminal of said fifth active device means and to said first terminal of said fourth active device means, said second terminal of said second resistive means being coupled to said second terminal of said fifth active device means; and fourth impedance means having a first terminal and a second terminal, said first terminal of said fourth impedance means being coupled to said second terminal of said fifth active device means and to said second terminal of said second resistive means, said second terminal of said fourth impedance means being coupled to said RF output port, said fourth impedance means having said first given resistive impedance, whereby said first given resistive impedance matches said second given resistive impedance thereby enabling said attenuator circuit to operate over a wide bandwidth range.

15. The attenuator circuit according to claim 14, wherein said first and said fifth active device means are metal-semiconductor field-effect transistors.

16. The attenuator circuit according to claim 14, wherein said second, said third and said fourth active device means are comprised of series combinations of a metal-semiconductor field-effect transistor and a thin-film resistor.

17. The attenuator circuit according to claim 14, wherein said first, said second, said third and said fourth impedance means are high-impedance microstrip transmission lines.

18. The attenuator circuit according to claim 14, wherein said first and said second resistive means are thin-film resistors.

19. The attenuator circuit according to claim 14, wherein said attenuator circuit is fabricated as part of a monolithic device.

20. The attenuator circuit according to claim 14, wherein said attenuator circuit provides constant normalized attenuation up to 20 GHz.

21. A digital attenuator circuit for attenuating RF signals, said attenuator circuit comprising:

an input terminal for receiving an input signal to be attenuated;

an output terminal for outputting the attenuated output signal;

impedance means extending between said input and output terminals, said impedance means comprising first and second transistors coupled in series between said terminals, each of said first and second transistors being controllable jointly to switch between a conducting state in which they define a low-loss through path between said input and output terminals and a non-conducting state;

active device means coupled to said impedance means, said active device means being adapted to attenuate said input signal when said first and second transistors are in said non-conducting state and being controllable to switch between a non-conducting and a conducting state, wherein said attenuator circuit is at a state of maximum attenuation when said active device means is in said conducting state and said transistors are in said non-conducting state and is at a state of minimum attenuation when said active device means is in said non-conducting state and said transistors are in said conducting state.

22. A circuit according to claim 21, wherein the impedance of said active device means in said non-conducting state is impedance by said impedance means when said transistors are in said non-conducting state.

23. A circuit according to claim 22, wherein said impedance means further includes first and second resistive means in parallel with said first and second resistive means, respectively, said resistive means being adapted to couple said active device means to said input and output terminals when said transistors are in said non-conducting state.

24. A circuit according to claim 21, wherein said active device means comprises a third transistor coupled to said impedance means at a junction between said first and second transistors.

25. A circuit according to claim 24, wherein said active device means further comprises fourth and fifth transistors, said fourth transistor being coupled to said impedance means at a junction between said input terminal and said first transistor and said fifth transistor being coupled to said impedance means at a junction between said second transistor and said output terminal.

26. A circuit according to claim 25, each of said third, fourth, and fifth transistors have a control terminal, said control terminals being connected together whereby said third, fourth, and fifth transistors may be controlled jointly to switch between said conducting and non-conducting states.

* * * * *